(12) United States Patent  (10) Patent No.: US 8,779,962 B2
Carpentier et al.  (45) Date of Patent: Jul. 15, 2014

(54) AUDIO DEVICE SWITCHING WITH REDUCED POP AND CLICK

(71) Applicant: Fairchild Semiconductor Corporation, San Jose, CA (US)

(72) Inventors: John L. Carpentier, Windham, ME (US); Julie Lynn Stultz, Scarborough, ME (US); Steven Macaluso, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/860,203

(22) Filed: Apr. 10, 2013

(65) Prior Publication Data

US 2013/0265184 A1   Oct. 10, 2013

Related U.S. Application Data

(60) Provisional application No. 61/622,192, filed on Apr. 10, 2012.

(51) Int. Cl.
*H03M 1/12*   (2006.01)

(52) U.S. Cl.
USPC .............. 341/155; 381/1; 381/98; 381/102; 381/11; 381/28; 381/103; 381/107; 704/201; 704/225; 704/500; 704/501; 379/242; 703/21; 710/8

(58) Field of Classification Search
CPC ..... H04M 1/725; H04M 20/26; H04M 13/00; H01R 31/06; H01R 31/719; H03R 13/66; H04N 1/00132; H04N 1/00137; H04N 1/00148; H04N 5/268; H04N 7/18; G06F 1/3203; G06F 3/16; H03G 5/005; H03G 3/348; G11C 11/143; G11C 7/1039; G11C 7/1078; G11C 7/1087; H04R 3/00; H04Q 3/52; H03M 1/12; H03M 1/34; H03M 1/123; G10L 19/24; G10L 21/0205
USPC .......... 341/155, 158, 172; 704/225, 201, 500, 704/501; 379/242; 703/21; 710/8; 381/1, 381/11, 24, 25, 28, 98, 102, 103, 107
See application file for complete search history.

(56) References Cited

U.S. PATENT DOCUMENTS

| | | | | |
|---|---|---|---|---|
| 5,056,148 | A * | 10/1991 | Hayashi | 381/123 |
| 5,942,998 | A * | 8/1999 | Matsuoka | 341/144 |
| 6,839,676 | B2 * | 1/2005 | Saito | 704/500 |
| 7,460,678 | B2 * | 12/2008 | Wei et al. | 381/98 |
| 7,924,189 | B2 * | 4/2011 | Sayers | 341/139 |
| 8,010,353 | B2 * | 8/2011 | Kawashima et al. | 704/225 |
| 2012/0259612 | A1 * | 10/2012 | Lyons et al. | 703/21 |

* cited by examiner

*Primary Examiner* — Lam T Mai
(74) *Attorney, Agent, or Firm* — Schwegman, Lundberg & Woessner, P.A.

(57) ABSTRACT

This document discusses, among other things, apparatus and methods including an analog-to-digital controller (ADC) configured to receive an enable signal and to provide an ADC output signal to control logic, wherein the control logic is configured to provide a control voltage to a control input of a switch. In an example, the control voltage includes the ADC output signal when the ADC output signal is below a first threshold or above a second threshold. In certain examples, the control logic is configured to transition the control voltage from the first threshold to the second threshold when the ADC output signal is between the first and second thresholds.

20 Claims, 4 Drawing Sheets

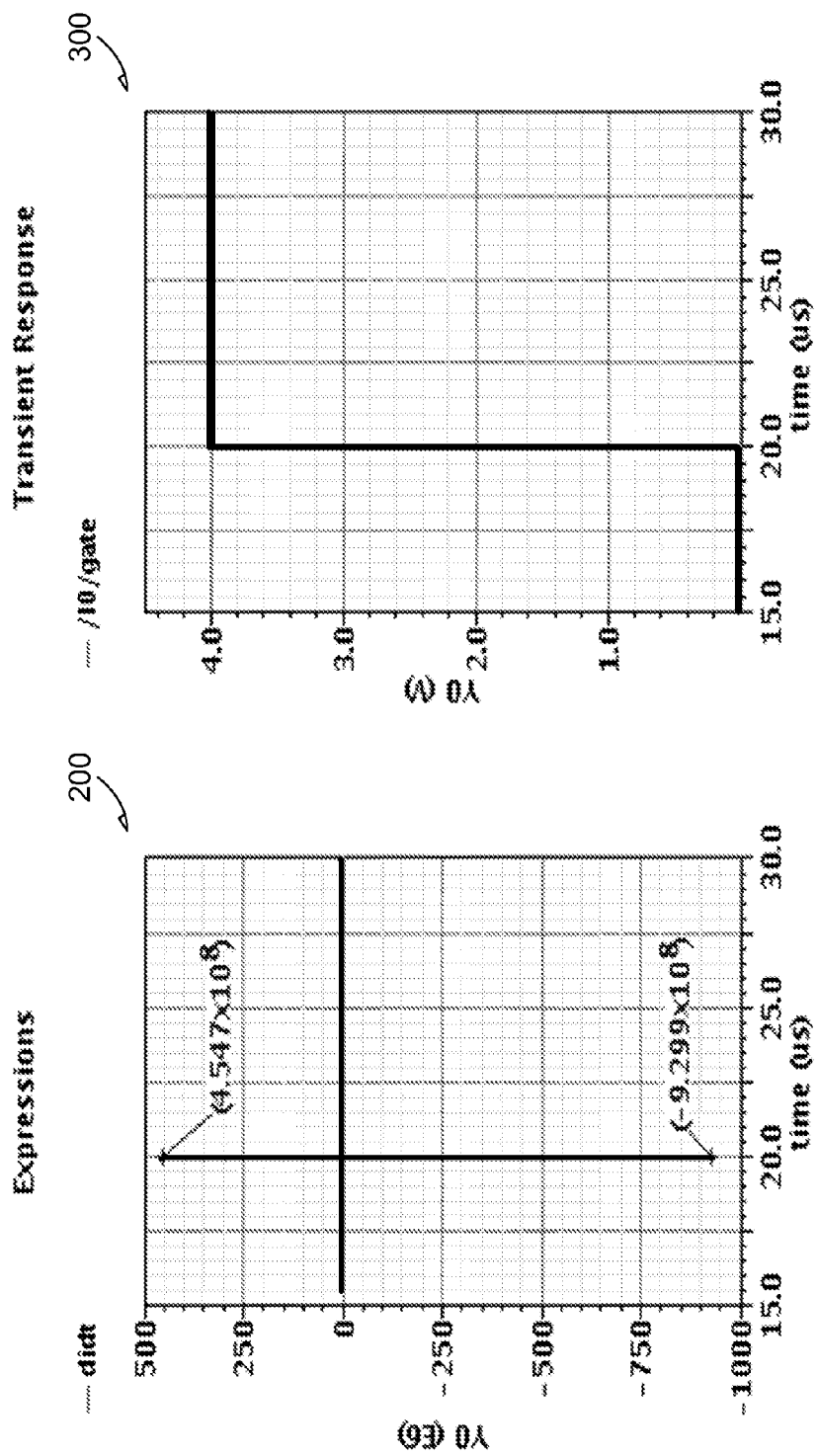

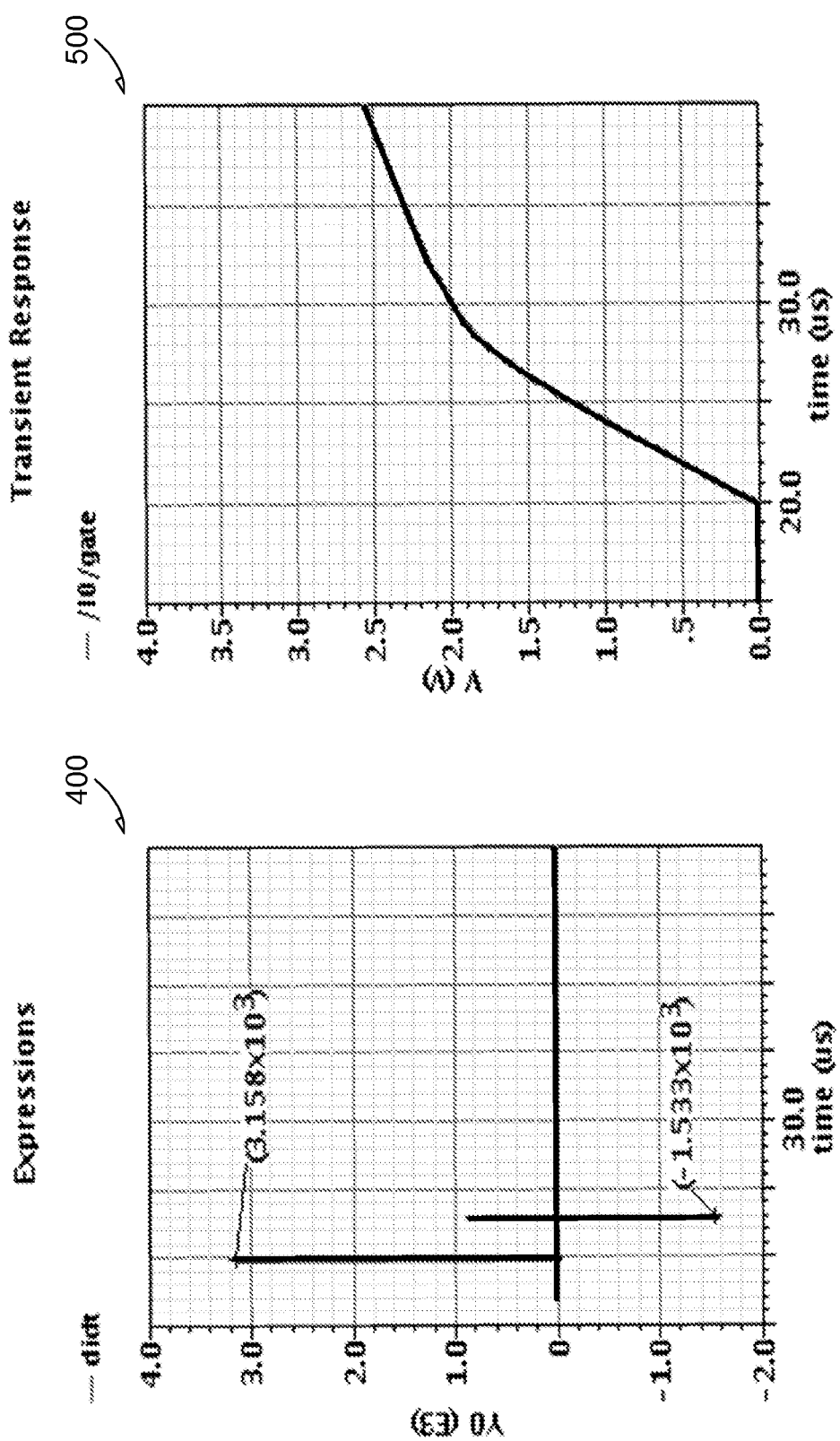

US 8,779,962 B2

AUDIO DEVICE SWITCHING WITH REDUCED POP AND CLICK

RELATED APPLICATION

The present application claims the benefit of priority to U.S. Provisional Patent Application Ser. No. 61/622,192, filed Apr. 10, 2012, which is incorporated herein by reference in its entirety.

BACKGROUND

In certain examples, switching between different potentials on a source and drain of a switch can be harmful or undesirable. For example, switching between different audio signals or an audio signal and ground, etc., can result in a "pop and click," a current spike, or one or more other undesirable effects.

A resistor-capacitor (RC) circuit can be used at the gate of a switch to slow an enable signal at the gate to suppress significant current spikes (dI/dt) that may be audible as a "pop and click." However, this slow switch enable can introduce a switch sensitivity to hot electron injection, increasing the operating temperature or leakage current of or otherwise affecting the switch.

OVERVIEW

This document discusses, among other things, apparatus and methods including an analog-to-digital controller (ADC) configured to receive an enable signal and to provide an ADC output signal to control logic, wherein the control logic is configured to provide a control voltage to a control input of a switch. In an example, the control voltage includes the ADC output signal when the ADC output signal is below a first threshold or above a second threshold. In certain examples, the control logic is configured to transition the control voltage from the first threshold to the second threshold when the ADC output signal is between the first and second thresholds.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 2-3 illustrate generally example traditional switching edge current and control voltage of a traditional switch.

FIGS. 4-5 illustrate generally example switching edge current and control voltage of a switch having a resistor-capacitor (RC) circuit at the gate of the switch to attenuate the enable signal.

DETAILED DESCRIPTION

The present inventors have recognized, among other things, a system and method for operating a switch, such as an audio switch, using an analog-to-digital converter (ADC), with or without a capacitor, to minimize or prevent "pop and click" or one or more other undesirable effects during device connection, disconnection, or when switching between signals at different potential while avoiding hot electron susceptibility and maintaining a relatively fast enable/disable time.

In an example, the ADC can reduce the "pop and click" by gradually actuating the switch using a controlled gate voltage potential and stepping over the high-risk region for hot electron susceptibility using a unique ADC step operation. Further, an internal or external capacitor can be connected to the input of the ADC to further control the voltage transition.

Figure 1:
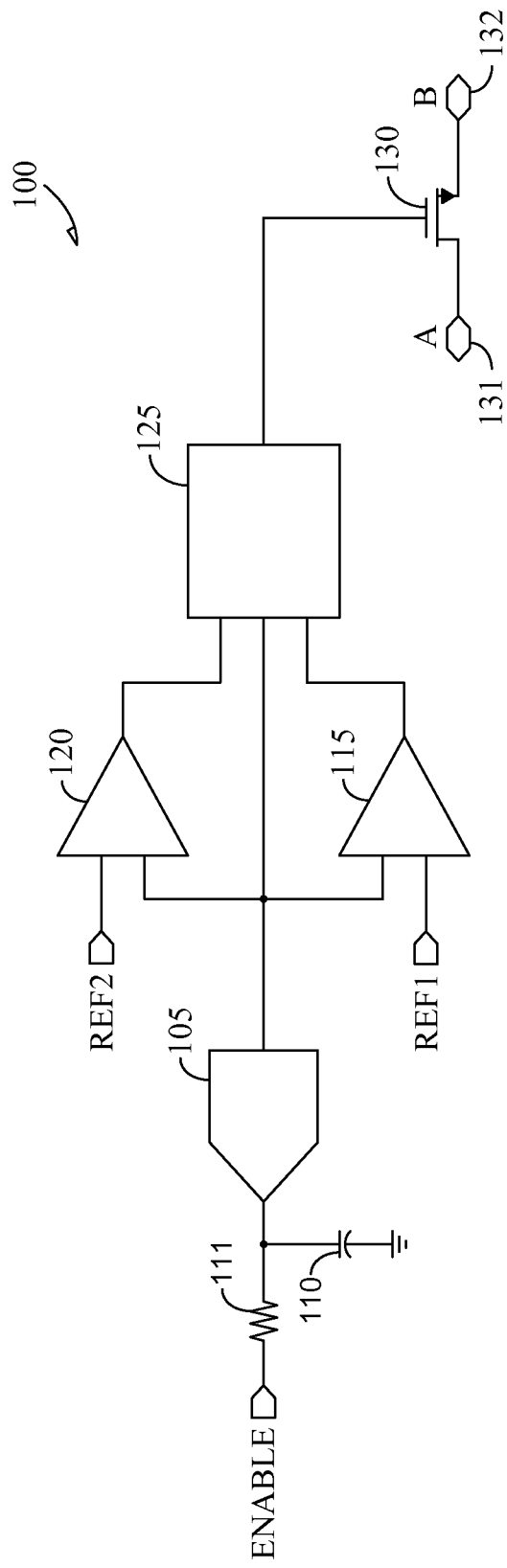
FIG. 1 illustrates generally an example of a system including an audio jack detection circuit.

FIG. 1 illustrates generally an example system 100 including an analog-to-digital controller (ADC) 105, a capacitor 110, and a switch 130 including first and second terminals (A, B) 131, 132. The ADC 105 can be configured to receive an enable signal (ENABLE) at an input and convert the enable signal into an ADC output signal including a number of voltage steps (e.g., 24 voltage steps, etc.) at an output. In an example, the voltage level of the ADC output signal can be compared to first and second reference voltages (REF1, REF2) using first and second comparators 115, 120, respectively. In an example, the first and second reference voltages can be set internally, by a user, as a portion of the supply voltage (VCC), etc.

In an example, the ADC 105 can be configured to receive the enable signal through a resistor-capacitor (RC) circuit, such as a series RC circuit including a series-coupled resistor 111 and a capacitor 110 coupled to ground. In certain examples, the RC circuit can be configured to attenuate the frequency of the enable signal at the input of the ADC 105. In other examples, one or more of the resistor 111 or the capacitor 110 can be omitted, or one or more other components can be added, depending on the desired response.

Figures 6, 7:
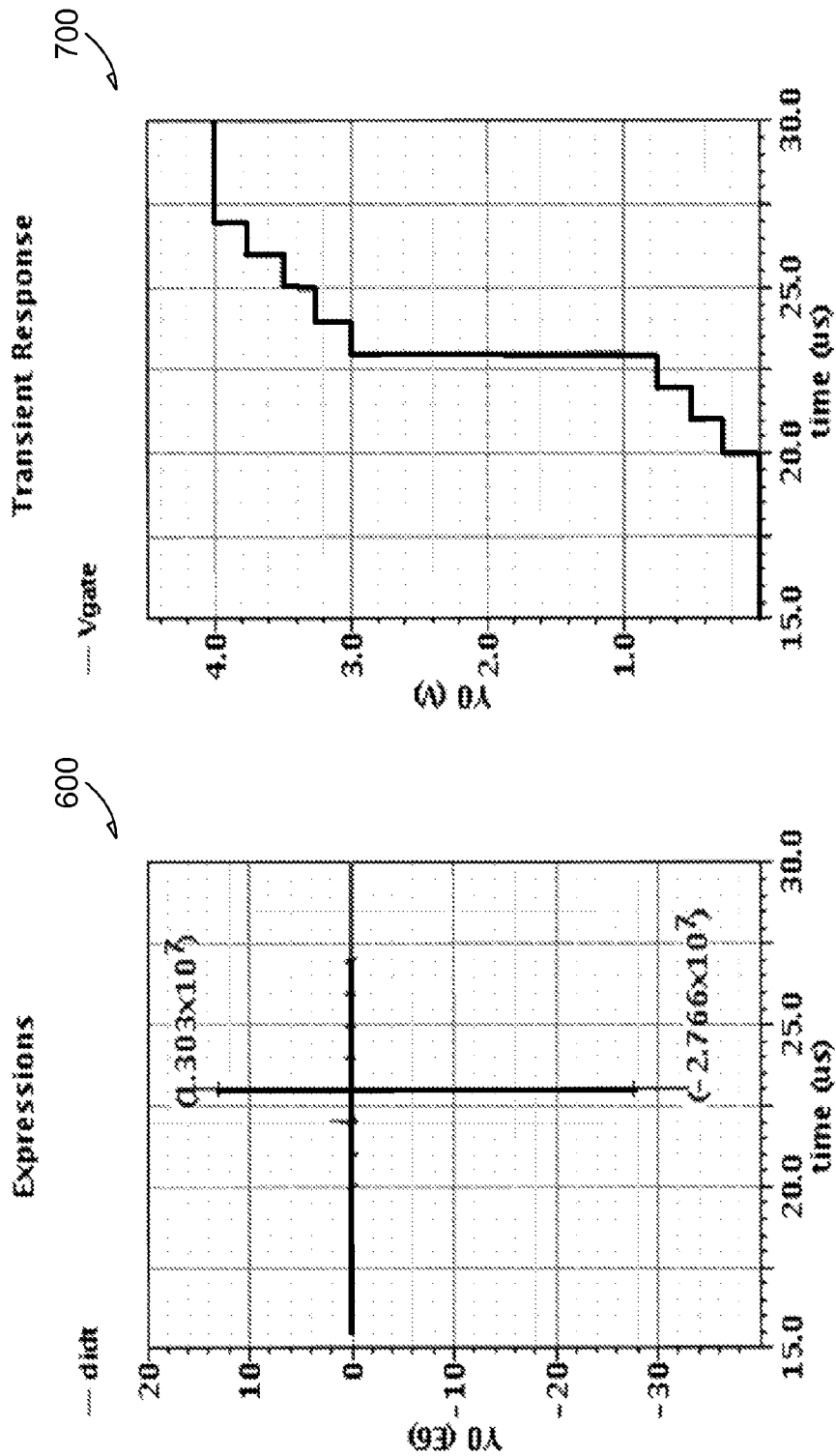
FIGS. 6-7 illustrate generally example switching edge current and control voltage of a switch having an analog-to-digital controller (ADC) at the gate of the switch to control the enable signal.

In an example, control logic 125 can be configured to receive the ADC output and the output of the first and second comparators 115, 120 and to provide a control voltage to drive the switch 130 using the received signals. For example, when the ADC output is below the first and second reference voltages, the control logic 125 can provide a first output, such as stepping the control voltage (e.g., as illustrated in FIG. 7 between 20.0 and 23.0 µs). When the ADC output is between the first and second reference voltages, the control logic 125 can provide a second output, such as quickly transitioning between the first and second reference voltages. When the ADC output is above the first and second reference voltages, the control logic 125 can provide a third output, such as stepping the control voltage (e.g., as illustrated in FIG. 7 between 23.0 and 27.0 µs.

In an example, the switch 130 can include a control input (e.g., a gate) configured to receive the control voltage and to control an impedance state between the first and second terminals 131, 132 (e.g., a high impedance or "off" state, a low impedance or "on" state, etc.). In certain examples, the control logic 125 can include a controller or one or more analog or digital components.

In an example, the first reference voltage can include 20% of the drain-to-source voltage (VDS) of the switch 130 and the second reference voltage can include 70% of the VDS of the switch 130. In other examples, one or more other reference voltages can be used. In certain examples, the control logic 125 can be configured to transition the control voltage between the first and second reference voltages quickly (e.g., nanoseconds) to minimize hot electron susceptibility between the first and second reference voltages. When the ADC output is outside of the first and second voltage references, the control logic 125 can be configured to provide a control signal including the ADC output to the control input of the switch 130.

In an example, the switch 130 can include an n-type semiconductor device, such as an n-type field effect transistor (FET), an n-type metal-oxide-semiconductor-field-effect-transistor (MOSFET), etc. In other examples, the switch 130 can include one or more other switches.

FIGS. 2-3 illustrate generally example traditional switching edge current 200 and control voltage 300 of a traditional switch. In certain examples, a traditional switch can be driven at a very fast edge rate, for example, in the nanosecond range. the resulting current spike (dI/dt) at the gate of the switch can be quite significant (e.g., an absolute maximum of ~9.3E8), enabled by a 10 ns input edge, for example.

FIGS. 4-5 illustrate generally example switching edge current 400 and control voltage 500 of a switch having a resistor-capacitor (RC) circuit at the gate of the switch to attenuate the enable signal. The RC circuit can reduce the current spike (dI/dt) at the gate of the switch. Although the RC circuit can reduce a "pop and click" at a switch transition, the slower gate edge can make the switch susceptible to hot electron injection. In an example, a transistor can be most susceptible to hot electron injection when the gate of the transistor is within 20%-50% of a drain-to-source voltage (VDS) of the switch. In other examples, the likely hot electron injection range can include one or more other portions of VDS. Further, using this technique, the turn-on time of the gate is substantially slower than in other implementations. For example, although the current spike (dI/dt) (at the gate of the switch is reduced compared to the examples of FIGS. 2-3 (e.g., an absolute maximum of ~3.2E3), the input edge of the switch gate spends ~7 μs in the hot electron susceptible region with a 4.0V supply.

FIGS. 6-7 illustrate generally example switching edge current 600 and control voltage 700 of a switch having an analog-to-digital controller (ADC) at the gate of the switch to control the enable signal. In an example, the ADC can be used to step the voltage at the gate of the switch to a first threshold voltage, to quickly transition the control voltage from the first threshold voltage to a second threshold voltage, and to step the control voltage from the second threshold voltage for the remainder of the transition. The ADC can be used to step the voltage from ground to a higher voltage, from ground to a lower voltage, between two different voltages, or from a positive or negative voltage to ground.

In the example of FIGS. 6-7, the first threshold voltage includes 20% of a drain-to-source voltage (VDS) of the switch and the second threshold voltage includes 75% of the DC value of the full enable signal. In other examples, the first and second thresholds can include one or more other voltages, such as a portion of the supply voltage (VCC), a portion of the full voltage of the enable signal, a portion of VDS, or one or more other threshold configured to provide a desirable switching transition. For example, the first and second threshold voltages can bound a voltage range where the switch is most susceptible to hot electron injection (e.g., between 20% and 70% of VDS, etc.).

In this example, the current spike (dI/dt) at the gate of the switch is further reduced in contrast to the examples illustrated in FIGS. 2-3 and 4-5 (e.g., an absolute maximum of ~2.8E7), while the gate of the switch remains in the hot electron susceptible region for less than 10 ns. Accordingly, both the current spike (dI/dt) and the time that the gate of the switch remains in the hot electron susceptible region is reduced using the systems and methods disclosed herein.

Additional Notes and Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
    an analog-to-digital controller (ADC) configured to receive an enable signal and to provide an ADC output signal including a plurality of voltage steps depending on the value of the enable signal; and
    control logic configured to receive the ADC output signal and to provide a control voltage to a control input of a switch,
    wherein the control voltage includes the ADC output signal when the ADC output signal is below a first threshold or above a second threshold, and
    wherein the control logic is configured to transition the control voltage from the first threshold to the second threshold when the ADC output signal is between the first and second thresholds.

2. The apparatus of claim 1, including the switch including first and second terminals and the control input.

3. The apparatus of claim 1, including:
    a capacitor coupled between an input of the ADC and ground.

4. The apparatus of claim 1, including:
    a series resistor-capacitor (RC) circuit coupled to an input of the ADC.

5. The apparatus of claim 1, wherein the switch includes an audio switch configured to switch an audio signal between the first and second terminals.

6. The apparatus of claim 1, wherein the switch includes a transistor including a gate, a source, and a drain,
    wherein the control input includes the gate,
    wherein the first terminal includes the source, and
    wherein the second terminal includes the drain.

7. The apparatus of claim 6, wherein the transistor includes an n-type field-effect transistor (FET).

8. The apparatus of claim 6, wherein the first threshold is a function of the drain-to-source voltage (VDS) of the transistor.

9. The apparatus of claim 6, wherein the second threshold is a function of the full potential of the enable signal.

10. The apparatus of claim 1, including:
    first and second comparators configured to compare the ADC output signal to first and second reference voltages, respectively,
    wherein the control logic is configured to provide the control voltage using outputs of the first and second comparators and the ADC output signal.

11. The apparatus of claim 10, wherein the first threshold is the first reference voltage and wherein the second threshold is the second reference voltage.

12. The apparatus of claim 1, wherein the control voltage includes the plurality of voltage steps of the ADC output signal when the ADC output signal is below a first threshold,
    wherein the control voltage includes the plurality of voltage steps of the ADC output signal when the ADC output signal is above a second threshold, and
    wherein the control voltage does not include the plurality of voltage steps of the ADC output signal when the ADC output signal is between the first and second thresholds.

13. A method comprising:
    receiving an enable signal at an analog-to-digital controller (ADC);
    providing an ADC output signal including a plurality of voltage steps depending on the value of the enable signal;
    receiving, at control logic, the ADC output signal; and
    providing, using the control logic, a control voltage to the control input of a switch,
    wherein the control voltage includes the ADC output signal when the ADC output signal is below a first threshold or above a second threshold, and
    wherein the control voltage transitions from the first threshold to the second threshold when the ADC output signal is between the first and second thresholds.

14. The method of claim 13, including receiving the enable signal through a series resistor-capacitor (RC) circuit.

15. The method of claim 13, wherein the switch includes a transistor including a gate, a source, and a drain, and
    wherein the first threshold is a function of the drain-to-source voltage (VDS) of the transistor.

16. The method of claim 13, wherein the second threshold is a function of the full potential of the enable signal.

17. The method of claim 13, including:
    comparing the ADC output signal to the first threshold; and
    comparing the ADC output signal to the second threshold,
    wherein the providing the control voltage to the control input of the switch includes using the comparisons.

18. The method of claim 13, wherein the providing the control voltage includes:
    providing the plurality of voltage steps of the ADC output signal when the ADC output signal is below a first threshold;
    providing the plurality of voltage steps of the ADC output signal when the ADC output signal is above a second threshold, and
    transitioning the control voltage from the first threshold to the second threshold when the ADC output signal is between the first and second thresholds, wherein the control voltage does not include the plurality of voltage steps of the ADC output signal when the ADC output signal is between the first and second thresholds.

19. A system comprising:
    a switch including first and second terminals and a control input;
    an analog-to-digital controller (ADC) configured to receive an enable signal and to provide an ADC output signal including a plurality of voltage steps depending on the value of the enable signal;
    a first comparator configured to compare the ADC output signal to a first threshold and to provide a first comparator output;
    a second comparator configured to compare the ADC output signal to a second threshold and to provide a second comparator output;

control logic configured to receive the ADC output signal and the first and second comparator outputs and to provide a control voltage to the control input of a switch; and a capacitor coupled between an input of the ADC and ground;

wherein the control voltage includes the ADC output signal when the ADC output signal is below a first threshold or above a second threshold, and wherein the control logic is configured to transition the control voltage from the first threshold to the second threshold when the ADC output signal is between the first and second thresholds, wherein the control voltage does not include the plurality of voltage steps of the ADC output signal when the ADC output signal is between the first and second thresholds.

20. The system of claim 19, wherein the switch includes an audio switch configured to switch an audio signal between the first and second terminals, wherein the audio switch includes a transistor including a gate, a source, and a drain, wherein the control input includes the gate, wherein the first terminal includes the source, wherein the second terminal includes the drain, wherein the first threshold is a function of the drain-to-source voltage (VDS) of the transistor, and wherein the second threshold is a function of the full potential of the enable signal.

* * * * *